United States Patent
Lim et al.

(10) Patent No.: US 7,582,954 B1
(45) Date of Patent: Sep. 1, 2009

(54) OPTICAL LEADLESS LEADFRAME PACKAGE

(75) Inventors: Peng Soon Lim, Melaka (MY); Terh Kuen Yii, Kuala Lumpur (MY); You Chye How, Melaka (MY); Sek Hoi Chong, Melaka (MY); Shee Min Yeong, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/037,007

(22) Filed: Feb. 25, 2008

(51) Int. Cl.
*H01L 31/0203* (2006.01)
*H01L 31/18* (2006.01)

(52) U.S. Cl. ............. 257/666; 257/433; 257/E31.11; 438/64

(58) Field of Classification Search .......... 438/106, 438/110, 120, 396; 257/666
See application file for complete search history.

(56) References Cited

U.S. PATENT DOCUMENTS

| 4,663,833 A | 5/1987 | Tanaka et al. |
| 4,766,095 A | 8/1988 | Hiroshi |
| 4,971,930 A | 11/1990 | Fusaroli et al. |
| 5,034,800 A | 7/1991 | Marchisi |
| 7,199,438 B2 | 4/2007 | Appelt et al. |

FOREIGN PATENT DOCUMENTS

JP    62-174956    7/1987

*Primary Examiner*—Zandra Smith
*Assistant Examiner*—Lawrence Tynes, Jr.
(74) *Attorney, Agent, or Firm*—Beyer Law Group LLP

(57) ABSTRACT

Apparatuses and methods directed to a semiconductor chip package having an optical component are disclosed. Packages include a die having a light sensing region and a stress buffer on a first surface, a first opaque encapsulant having an opening therethrough disposed atop the first surface, and a second transparent or translucent encapsulant formed within the first encapsulant opening and directly atop and contacting the light sensing region. A leadless leadframe or other conductive component can be coupled to a second surface of the die. The die may also have light sensitive regions that are shielded by the first encapsulant and/or stress buffer. The stress buffer can be a layer formed at the wafer stage or a dam formed at the panel stage. A customized mold is used while dispensing the first encapsulant such that the opening therethrough is properly formed.

7 Claims, 6 Drawing Sheets

OPTICAL LEADLESS LEADFRAME PACKAGE

TECHNICAL FIELD

The present invention relates generally to the packaging of integrated circuit devices, and more particularly to the use of an optical component or window in integrated circuit packages and methods of creation thereof.

BACKGROUND

Many integrated circuit ("IC") devices require exposure to a source of light at a point during their operational cycle. Such IC devices can include, for example, EPROMs, CCD imaging chips, and various other chips or IC devices with a light sensing component. In many such IC devices that require some sort of exposure to light, and indeed in most all IC devices, the device must generally be enclosed in a sealed environment to protect it and its associated electrical connections from damage due to exposure to the outside environment. Accordingly, numerous conventional packages for IC devices involve the formation of a window or other transparent component that enables light to reach one or more components on the IC device.

Early IC device packages designed to address this issue have involved the formation of a ceramic base and lid adapted to support the IC device, as well as a transparent window situated near the light sensing component. Later packages to accomplish this light providing function have included a transparent plastic or other material as the actual encapsulant for the IC device. As will be readily understood, the term "translucent" may be used in place of the terms "transparent" or "clear" for many of the items, materials and/or other light specific applications throughout this disclosure. Various references that involve providing light to a packaged IC device or component via a transparent or translucent window or other light passing channel can be found at, for example, U.S. Pat. Nos. 4,663,833; 4,766,095; 4,971,930; 5,034,800 and 7,199,438, as well as Japanese Patent No. 62-174956.

Where a light passage through a package is provided by using transparent material as the encapsulant for an IC device, several problems have arisen. For one thing, an encapsulant made entirely of transparent material can result in a package that allows light to reach places on the IC device where light is not desirable. For another, the production of a transparent compound to use as an encapsulant can be significantly more costly than the production of a typical silica-based encapsulant compound. Often, the cost of a transparent encapsulant compound can be roughly ten times that of a regular encapsulant compound. Another drawback is that transparent encapsulant compounds are typically produced by removing black pigment and silica from a regular encapsulant compound, which results in a clear compound that is less able to withstand stresses and thermal shock effects. As yet another drawback, many transparent encapsulant compounds are not readily marked by laser markings, which is a preferred way to mark the outside of a packaged chip. As such, packages having an entirely transparent encapsulant material are difficult or impossible to laser mark.

While many of the devices and techniques to provide light to an IC device via a packaging feature have generally worked well in the past, there is always a desire to provide more reliable and cost effective ways for packaging such IC devices.

SUMMARY

It is an advantage of the present invention to provide improved integrated circuit packages having optical windows or components. This can be accomplished at least in part through the use of two different types of encapsulant materials, with a stronger but opaque first encapsulant forming a substantial part of the encapsulated seal around an IC device, and a transparent second encapsulant forming a window or light tunnel in an opening the first encapsulant such that light from an outside light source is able to reach a light sensing region on the IC device.

It is an additional advantage of the present invention to provide such a package in a cost effective and efficient manner. This can be accomplished at least in part through the use of a stress buffer that facilitates the efficient manufacture of such an IC device with an encapsulant package having two different encapsulant materials.

In various embodiments, an IC device includes a die having a light sensing region disposed on a first surface, a first encapsulant formed on the die and arranged such that the light sensing region can be exposed to a light source, and a second encapsulant formed directly atop the light sensing region and adjacent to or within the first encapsulant. The first encapsulant comprises an opaque material arranged such that the light sensing region can be exposed to the light source, while the second encapsulant comprises a transparent or translucent material, such that it can transmit light therethrough from the light source to the light sensing region. The IC device can be used with leadless leadframe packages, although it can also be used with packages having other suitable conductive components.

In various embodiments, a stress buffer can be included as part of the IC device. The stress buffer can be disposed on the first surface of said die, and can be arranged such that the light sensing region can be exposed to the light source. The stress buffer may surround the light sensing region in some embodiments. The stress buffer can be a layer that is created at the wafer level, or can be a dam type structure that is created at the panel level. In some embodiments, the die can include one or more light sensitive areas to be shielded from the light source, and such shielding can be accomplished by the first encapsulant and/or stress buffer. In some embodiments, the first encapsulant includes one or more laser markings on an outer surface thereof.

In various embodiments, methods for manufacturing an integrated circuit device or package therefore are disclosed. Process steps can include creating a die having a light sensing region, forming a stress buffer on the die such that the light sensing region can be exposed to an external light source, placing a mold directly against the stress buffer, dispensing a first encapsulant over the die while said mold remains in place, removing the mold after said first encapsulant has been dispensed, and dispensing a second encapsulant into an opening in the first encapsulant left behind by the mold. As in the foregoing embodiments, the mold can be adapted to facilitate the creation of an opening above the light sensing region when an encapsulant is dispensed thereabout. The first encapsulant can comprise an opaque material, and can be dispensed such that an opening above the light sensing region is created therein due to the presence of the mold. Also, the second encapsulant can comprise a transparent or translucent material and be adapted to transmit light therethrough from the light source to the light sensing region.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for providing optical IC device packages. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

Figure 1A:
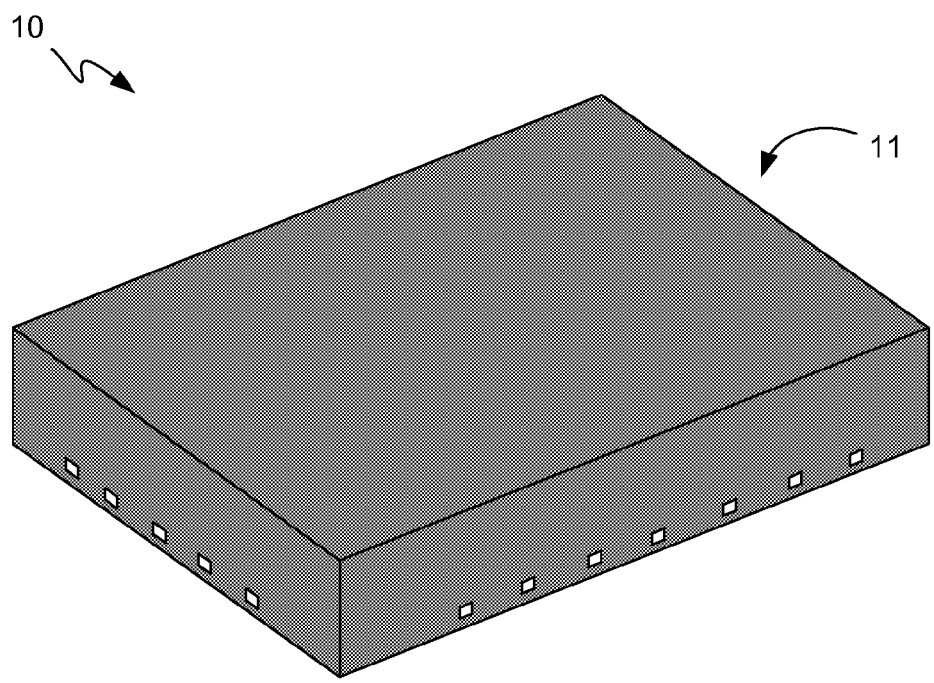
FIG. 1A illustrates in top perspective view an exemplary packaged IC device.
Figure 1B:
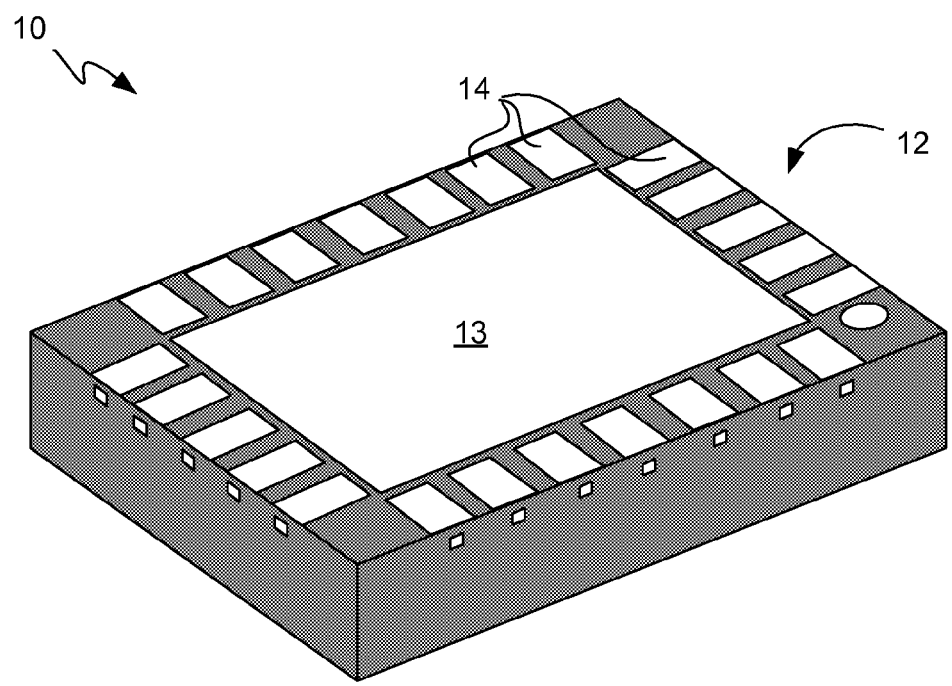
FIG. 1B illustrates in bottom perspective view the IC device of FIG. 1A.

Referring first to FIGS. 1A and 1B, an exemplary packaged IC device is shown in top and bottom perspective views respectively. As shown, packaged IC device 10 can have a top surface 11 and a bottom surface 12. Bottom surface 12 can include a die attach pad 13 and a plurality of contacts 14 arranged thereabout, such as in a leadless leadframe package formation, as shown. Such a leadless leadframe package can be, for example, that which is designed and manufactured by National Semiconductor Corporation of Santa Clara, Calif. Of course, other suitable leadless leadframe packages may also be used, and it will be readily understood that the present invention can be used with other types of packaging arrangements, such that its use is not limited to packages having leadless leadframes. Although the detailed description herein references leadless leadframes, such references are for purposes of illustration only, and it will be appreciated that the disclosed apparatuses and methods can be adapted for use with other packaging types and techniques. IC device 10 as shown can be substantially similar to an IC device having an optical component, such as that which is described in greater detail below.

Figure 2A:
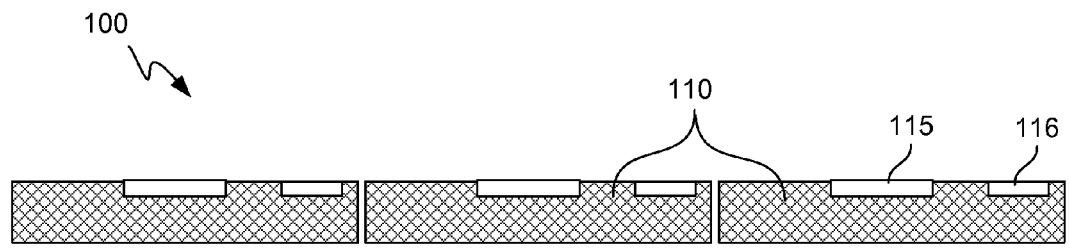
FIG. 2A illustrates in partial side cross-sectional view an exemplary semiconductor wafer having a plurality of IC devices.

Turning next to FIG. 2A, an exemplary semiconductor wafer having a plurality of IC devices is illustrated in partial side cross-sectional view. Wafer 100 can have a plurality of dice 110 having a first surface, one or more of which may comprise one or more light sensing regions 115 and/or one or more light sensitive areas 116 that must or should be shielded from light. Such light sensing regions 115 can comprise an area on the noted first surface of the dice 110, and/or may be light sensors atop or about the first surface, for example. Although only three dice 110 have been shown for purposes of illustration, it will be readily appreciated that wafer 100 can include dozens or even thousands of such dice, which can all be identical, or can have differing features, as may be desired.

Figure 2B:
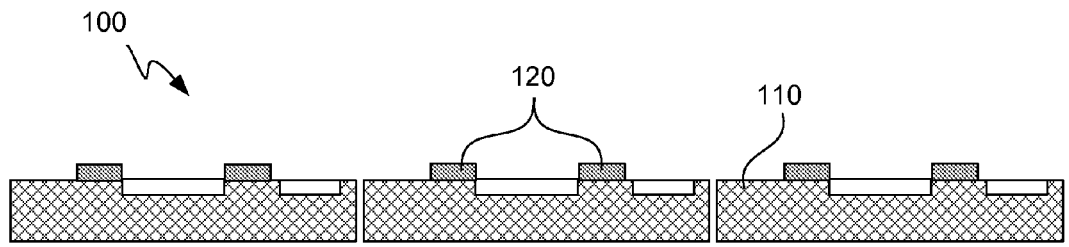
FIG. 2B illustrates in partial side cross-sectional view the semiconductor wafer of FIG. 2A having a stress buffer material disposed thereupon.

Continuing on to FIG. 2B, the semiconductor wafer of FIG. 2A is shown as having a stress buffer disposed thereupon, again in partial side cross-sectional view. While still at the wafer stage, a stress buffer 120 may be disposed atop dice 110. Such a stress buffer 120 can comprise, for example, benzocyclobutene, polybenzoaxole, a polyimide, or any other suitable material adapted to absorb or otherwise account for stresses atop the first surface of the dice 110. Stress buffer 120 can be disposed at the wafer level via, for example, screen printing, spin coating, a dry film process, or any other suitable wafer level application process for such stress buffer materials. Stress buffer 120 can be formed and arranged so as to surround the light sensor or light sensing region 115 of each die 110, such that an outside light source will be able to provide light thereto, as will be readily appreciated. As shown, stress buffer 120 may be disposed as a layer such that one or more light sensitive areas 116 are not covered by the stress buffer 120. Alternatively, stress buffer 120 can be created at the panel level using a "dam and fill" type approach, as will be readily understood. Such an alternative approach may require the use of different types of materials for the stress buffer. By way of example, a liquid encapsulant material having a flexural strength of 0.1 GPa and a flexural modulus of 12 GPa, such as that which is made by the Sumitomo Corporation of Tokyo, Japan, is known to work well for such "dam and fill" type purposes. Stress buffer 120 can also be designed to cover one or more of light sensitive areas 116.

Figure 2C:
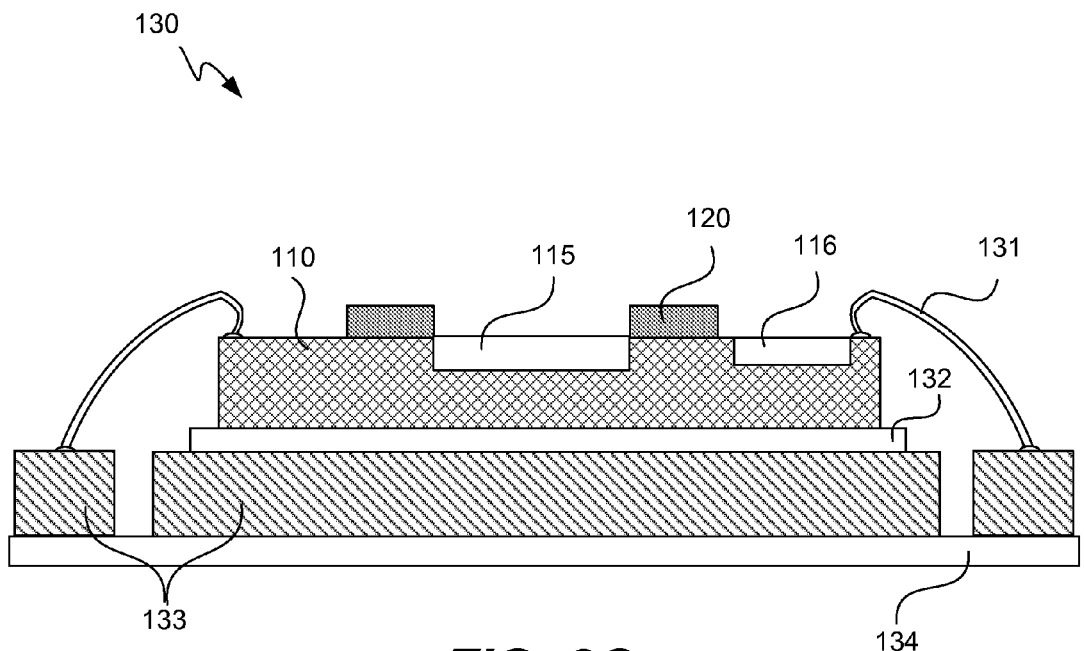
FIG. 2C illustrates in side cross-sectional view an exemplary IC device having been singulated from the wafer of FIG. 2B and attached and wire bonded to a panel having an attach tape according to one embodiment of the present invention.

Moving next to FIG. 2C, one IC device from the wafer of FIG. 2B is shown in side cross-sectional view as having been singulated from the wafer and attached and wire bonded to a panel. As shown, partially packaged IC device 130 can include a die 110 having one or more light sensors or light sensing regions 115, one or more light sensitive areas 116. Die 110 can be attached to a conductive connector element, such as leadless leadframe 133, with attachment being made by an epoxy layer 132 or other suitable fastener. Wire bonds 131 can be used to electrically couple specific regions of the die 110 to connectors on the leadless leadframe 133, with such usage being readily understood by those skilled in the art. A backing tape such as high temperature attach tape 134 can be used as a temporary backing to partially packaged IC device 130, as will be readily appreciated.

Figure 3A:
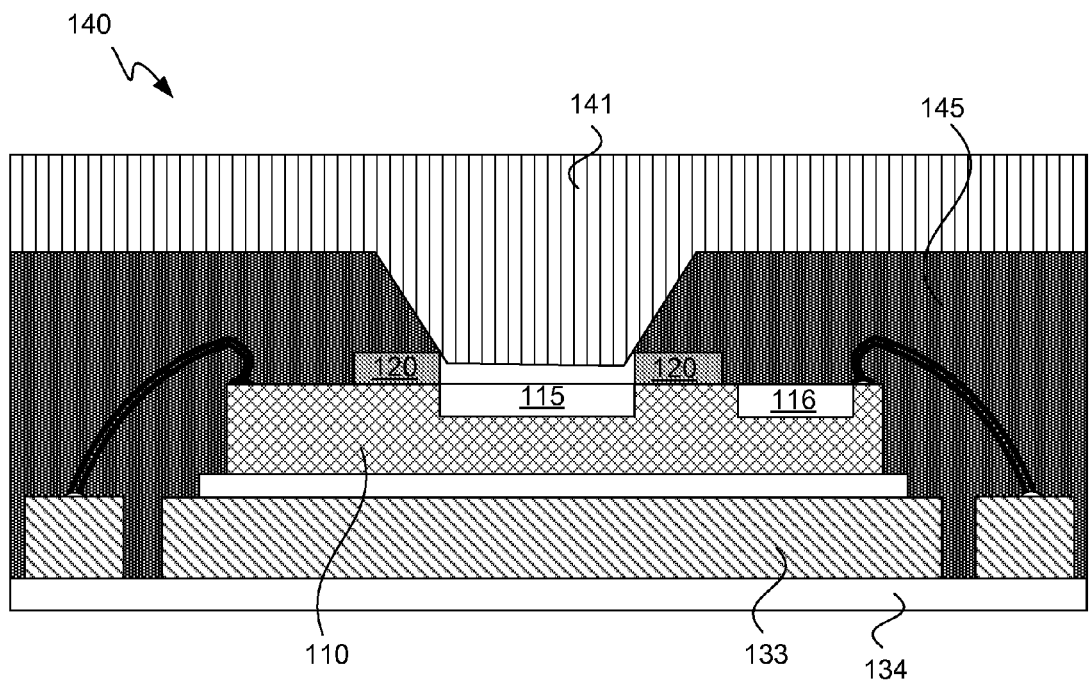
FIG. 3A illustrates in side cross-sectional view the IC device of FIG. 2C after the placement of a customized mold and dispensing of a first opaque encapsulant according to one embodiment of the present invention
Figure 3B:
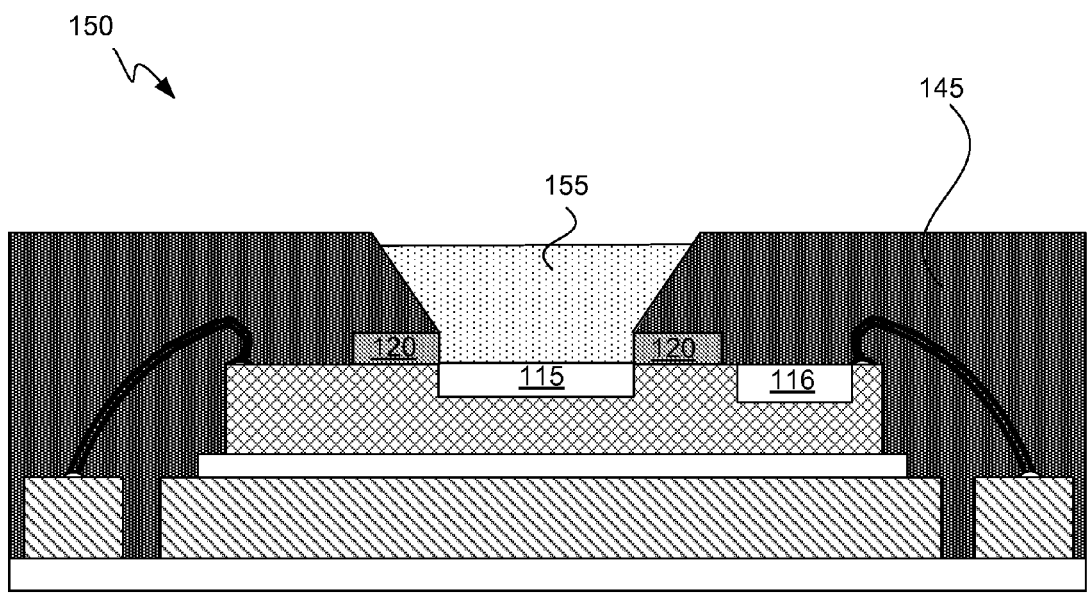
FIG. 3B illustrates in side cross-sectional view the IC device of FIG. 3A after the removal of the customized mold and dispensing of a second transparent encapsulant according to one embodiment of the present invention

The IC device of FIG. 2C is again illustrated in side cross-sectional view in subsequent process phases shown in FIGS. 3A and 3B. In FIG. 3A, a customized mold has been placed against the IC device, and a first opaque encapsulant has been dispensed thereabout. Partially packaged IC device 140 can be created by taking the device 130 of FIG. 2C and placing and holding a mold 141 directly against the stress buffer 120. Mold 141 may be customized for this particular purpose, and can be shaped such that many or all IC devices in an entire panel may be processed in an identical or similar manner simultaneously or at a similar stage in the manufacturing process. As such, a lower protrusion as shown may exist in mold 141 for each optical IC device to be processed in the same panel, such that mold 141 can include dozens or hundreds of such customized protrusions.

As shown in FIG. 3A, the lower protrusion of customized mold 141 can contact stress buffer 120 such that a cavity is created between the mold 141, the stress buffer 120 and the light sensing region or sensor 115, and also such that a seal is created to seal this cavity for the subsequent introduction of a first encapsulant 145. Although the bottom surface of this lower protrusion of mold 141 is shown as being smaller than the opening formed in stress buffer 120, it will be readily appreciated that such a bottom surface can also be larger than this stress buffer opening. In the event that the bottom surface of the lower protrusion of mold 141 is larger than the opening in the stress buffer 120, then the lower protrusion of the mold would simply abut the upper surface of the stress buffer, rather than extend partially into it. In either situation, a cavity above the light sensing region 115 is created, which cavity is then sealed by the contact of the mold 141 against the stress buffer 120.

Stress buffer 120 can be specifically designed to serve multiple purposes. For example, this stress buffer can accept the actual contact and absorb much or all of the stresses introduced by placing and holding the customized mold 141 against the partially packaged IC device, such that the die 110 and various components thereof are protected from potential damages by the use of the mold. Stress buffer 120 can also serve to work with mold 141 to create a sealed off cavity above the light sensing region 115, such that a first opaque encapsulant 145 does not contact or cover the light sensing region when this encapsulant is dispensed thereabout. Stress buffer 120 can also be used to cover one or more light sensitive areas 116, such that these areas are not exposed to light, regardless of the final formation or design of the first opaque encapsulant 145 and any other encapsulant or process components. Stress buffer 120 can also be designed to accomplish other objectives for the manufacture of the subject IC device and/or to function within the final IC device, as will be appreciated.

While customized mold 141 is held in place against stress buffer 120, a first encapsulant 145 can be formed in the space created between the die 110 and the mold. Such an encapsulant can be any suitable plastic or other type of encapsulant typically used for encapsulating IC devices. For example, various silica-based compounds are known to work well for such encapsulating purposes, and are also known as good materials for absorbing and reducing stresses and thermal shocks to the overall packaged device. As is well known, many such encapsulants are opaque in nature, and black is a typical known color. It is preferable that the disclosed first encapsulant 145 be a good stress and thermal shock absorber, such that this first encapsulant can be any suitable opaque encapsulant that may be readily applied between the mold 141 and the die 110, so as to encapsulate the die, wire bonds, leadframe and all other packaged components therein.

As shown in FIG. 3A, first encapsulant 145 does not fill space occupied by mold 141, which space deliberately includes a region directly above the light sensing region or sensor 115. First encapsulant is thus formed such that an opening above this light sensing region is created therein. Although an inverted pyramid type shape is shown, it will be readily appreciated that this opening in the first encapsulant can be of any shaped desired, such as, for example, conical or cylindrical. Whichever shape of opening is desired, customized mold 141 can simply be created to result in the desired opening shape in the later formed first encapsulant 145. As will also be readily appreciated, mold 141 can be formed of a durable material, such that it may be used repeatedly in the processing of many panels of packaged devices.

In FIG. 3B, customized mold 141 has been removed and a second encapsulant 155 has been dispensed to create partially packaged IC device 150. Since the desired package is to be an optical package, second encapsulant 155 preferably comprises a transparent material, and is dispensed in the opening created in first opaque encapsulant 145, such that a fully encapsulated device having an optical window or light tunnel through the packaging is created. Light from an outside light source can then access the light sensor or sensing region 115 via the transparent second encapsulant 155 situated directly above this light sensor or sensing region. This second encapsulant 155 can contact the actual light sensing region 115, since it is a transparent component and is intended to seal the device around this region.

Figure 4A:
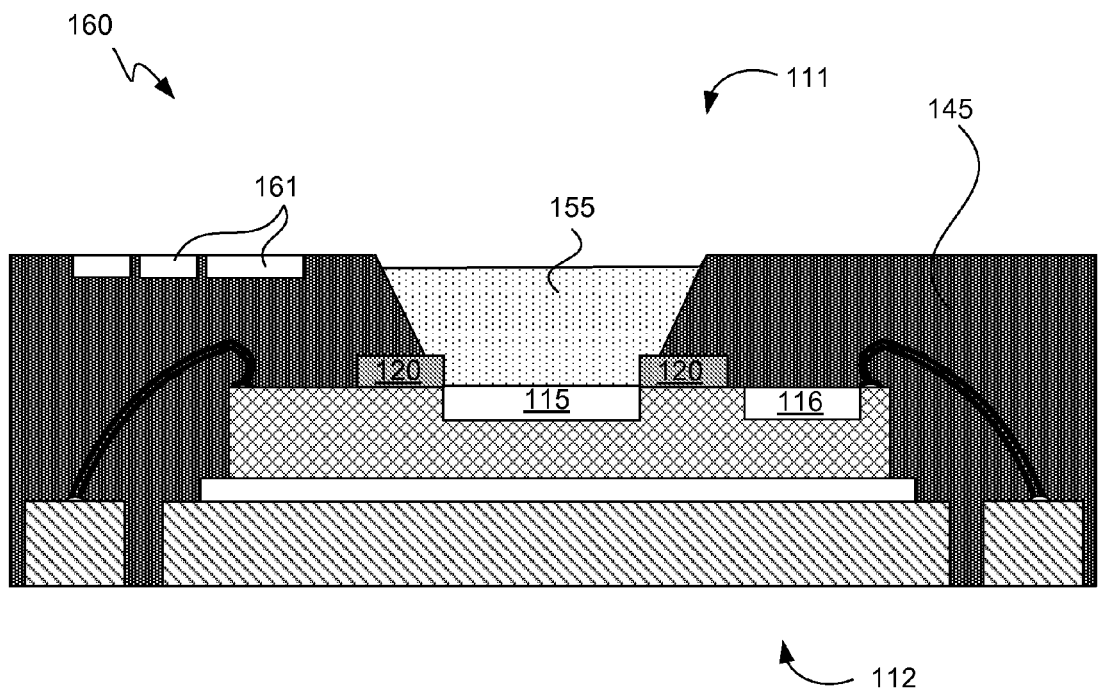
FIG. 4A illustrates in side cross-sectional view the IC device of FIG. 3B after the removal of the attach tape and application of laser markings to the first encapsulant according to one embodiment of the present invention.
Figure 4B:
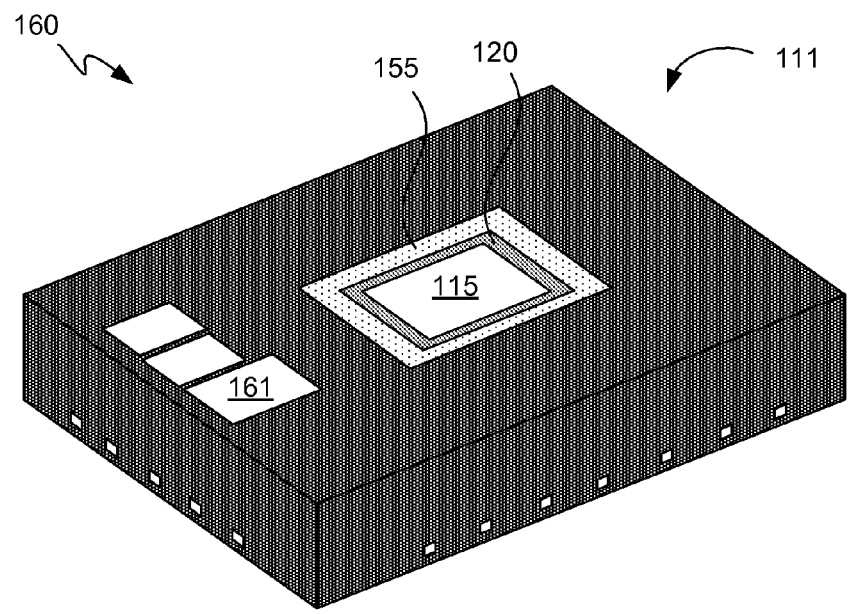
FIG. 4B illustrates in top perspective view the IC device of FIG. 4A according to one embodiment of the present invention.

Moving next to FIG. 4A, the IC device of FIG. 3B has been processed further to arrive at a fully packaged IC device 160. As will be readily appreciated, a variety of standard processing steps can be applied to the previous partially packaged IC device 150 to arrive at finished IC device 160. For example, attach tape 134 can be removed from bottom surface 112, the outer surface of the first encapsulant 145 can be laser marked, the IC device can be appropriately plated, and the device can be singulated from its panel, among other process steps. Laser markings 161 are shown on a top surface 111 of the overall package, and it will be readily appreciated that such laser markings are better suited for placement on the opaque material of the first encapsulant, rather than the clear material of the second encapsulant. FIG. 4B simply illustrates in top perspective view the IC device of FIG. 4A. As shown, the "window" or light tunnel created by the second encapsulant within the first encapsulant can be rectangular in nature, although it will be appreciated that other shapes and formations may also be used. For example, a circular or oval shape may also work well for the intended purposes of the overall optical package.

As can be seen, the selective and limited use of second transparent encapsulant 155 results in an overall package having an encapsulant that is mostly opaque and relatively strong (i.e., first encapsulant 145), but that is conveniently transparent although relatively weaker in the desired location(s) (i.e., second encapsulant 155). Together, these first and second encapsulants provide an overall package that completely encapsulates the IC device contained inside, that is relatively strong compared to many optical packages, that provides the ability for an outside light source to shed light on an internal light sensor or region, and that is relatively inexpensive to manufacture.

Figure 5A:
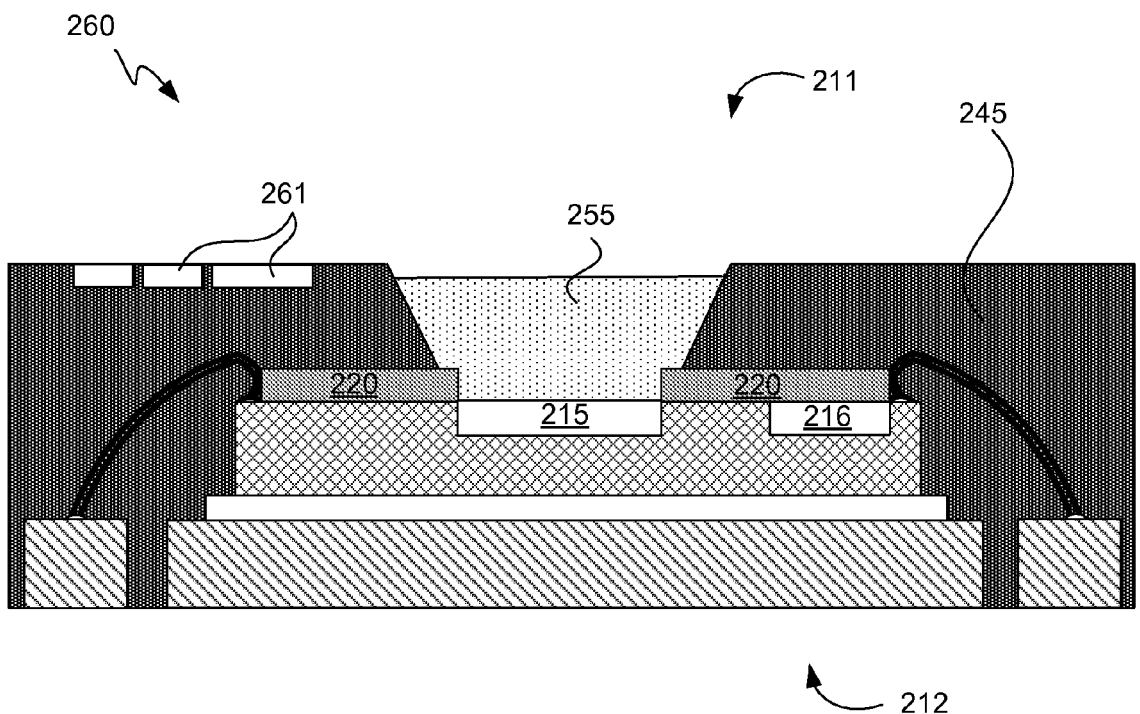
FIG. 5A illustrates in side cross-sectional view an alternative but similar IC device according to one embodiment of the present invention.
Figure 5B:
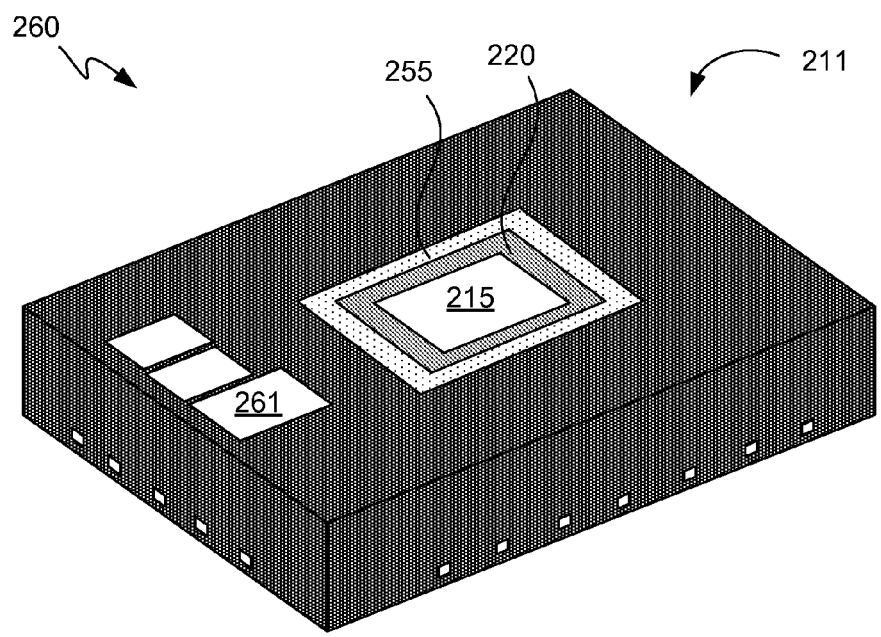
FIG. 5B illustrates in top perspective view the IC device of FIG. 5A according to one embodiment of the present invention.

Turning now to FIGS. 5A and 5B, an alternative but similar IC device is depicted in side cross-sectional and top perspective views according to an alternative embodiment of the present invention. Fully packaged IC device 260 can be similar or even identical to IC device 160 detailed above in numerous ways. For example, the subject IC die can have a light sensor or region 215, one or more light sensitive areas 216, a first opaque encapsulant 245, a second clear encapsulant 255 formed in an opening within the first encapsulant, and laser markings 261 on a top surface 211, which is opposite a bottom surface 212.

Unlike the previous fully packaged IC device, however stress buffer 220 is created so as to cover one or more light sensitive areas 216. Again, such a stress buffer 220 can be created at the wafer level using any of a variety of wafer processing techniques, or can be created at the panel level using a dam and fill type of approach. As in the foregoing embodiments, the particular material used for the stress buffer 220 can vary, depending upon how it is applied.

As can be seen in FIGS. 3A, 4A and 5A, the customized mold can be designed such that the surface of its lower protrusion extends into the cavity above the light sensor, or such that it abuts the upper surface of the stress buffer directly. As will be readily appreciated, the former arrangement is reflected in the illustration of FIG. 3A, while the latter arrangement is reflected in the illustrations of FIGS. 4A and 5A. As seen in these last two figures, the opening in the first encapsulant (and thus the entire second encapsulant) is shaped as a result of the customized mold having abutted against the top of the stress buffer. Either arrangement is acceptable, since either arrangement accomplishes the preferable objectives that the customized mold not contact the light sensor, and that the cavity directly above the light sensor be sealed off for the application of the first encapsulant.

Figure 6:
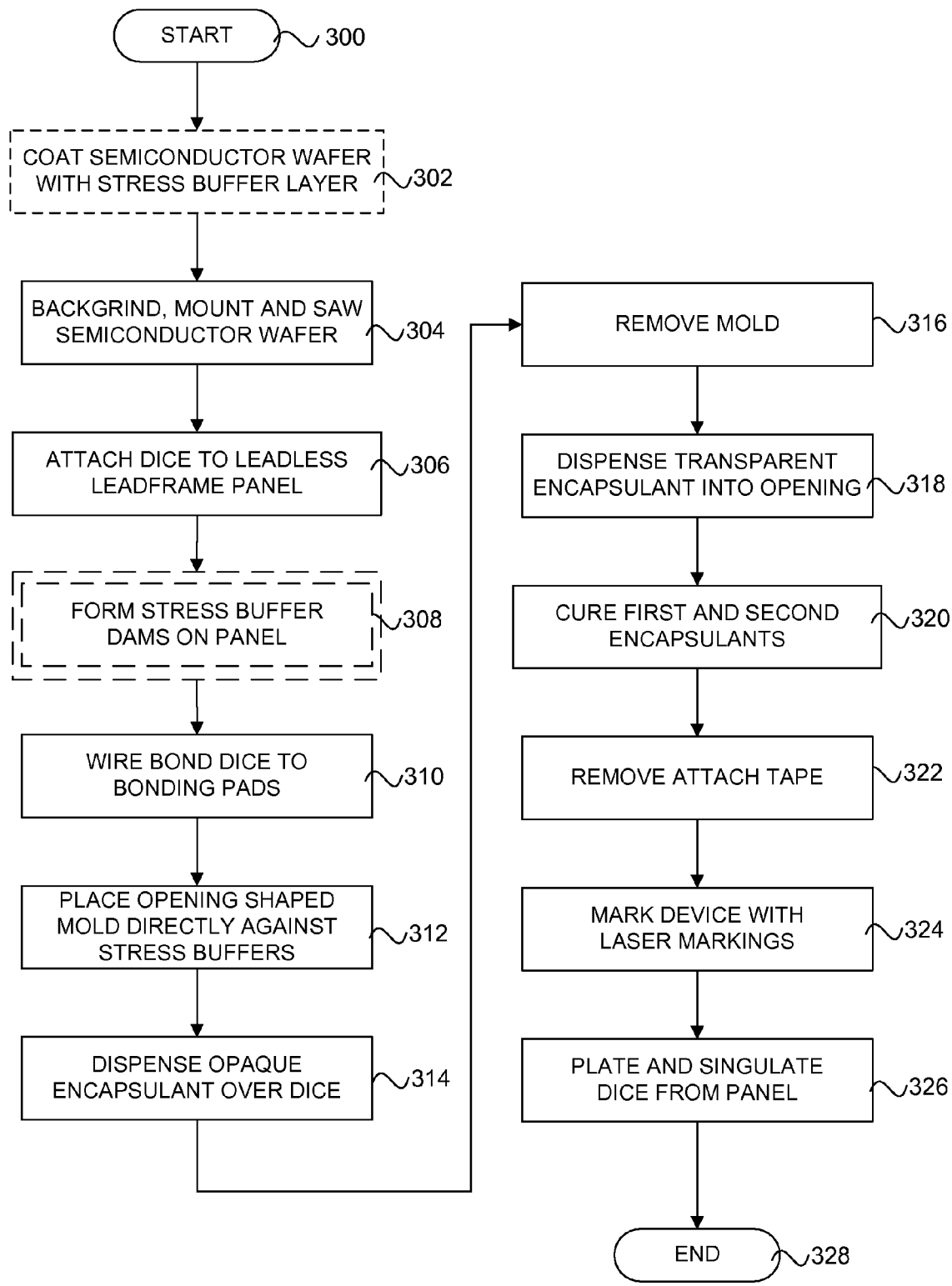
FIG. 6 illustrates a flowchart presenting exemplary methods of manufacturing the IC devices of FIGS. 4A and 5A according to various embodiments of the present invention.

FIG. 6 illustrates a flowchart presenting exemplary methods of manufacturing the IC devices of FIGS. 4A and 5A according to various embodiments of the present invention. It will be readily appreciated that the methods and flowchart provided herein are merely exemplary, and that the present invention may be practiced in a wide variety of suitable ways. While the provided flowchart may be comprehensive in some respects, it will be readily understood that not every step provided is necessary, that other steps can be included, and that the order of steps might be rearranged as desired by a given manufacturer, as desired.

After start step 300, a semiconductor wafer can be coated with a stress buffer layer at process step 302. Such a wafer coating step is optional, however, and may be foregone in the event that the stress buffer is to be added at the panel level instead. After the stress buffer is added, various backgrinding, mounting and sawing processes may then be performed on the wafer at process step 304.

At subsequent process step 306, individual dice are then attached to a panel, which panel can be, for example, a leadless leadframe panel. Stress buffer dams can then be formed on the panel at process step 308. As in the foregoing stress buffer step, the formation of stress buffer dams at the panel level is optional, and can be foregone in the event that the stress buffer was already formed at the wafer level. Wire bonding of dice to bonding pads can then be accomplished at process step 310.

Detailed formation of the inventive package continues at process step 312, as a customized mold is placed directly against various stress buffer components at the various dice on the subject panel. As noted above, this customized mold can various shapes designed to result in "openings" in an encapsulant material that is to be dispensed with the mold in place. A first opaque encapsulant is then dispensed at process step 314, and the mold is removed thereafter at process step 316. After the mold is removed, a second transparent encapsulant is dispensed into the openings in the first encapsulant at process step 318. The first and second encapsulants can then be cured at process step 320.

In various embodiments, the two encapsulants can be cured together. Alternatively, the first encapsulant can be cured before the second encapsulant is applied. The attach tape can be removed at process step 322, the package can be marked with laser markings at process step 324, and the device can be plated and singulated from the panel at process step 326. The method then ends at end step 328.

As will be appreciated, the foregoing method can be made to reflect some or all details of the stages depicted in FIGS. 2A through 5B above. Furthermore, steps may be performed in a different order, as may be preferred. For example, laser markings on an outer surface of the various dice may take place after plating and singulation from their respective panels. In addition, various steps may be performed at the wafer level over the panel level, or vice versa. In some embodiments, the use of various processes requiring a panel may be foregone in favor of other methods that do not require such a panel type manufacturing stage or process.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. An optical leadless leadframe package, comprising:
   a die having a light sensing region disposed on a first surface thereof;
   a leadless leadframe coupled to a second surface of said die;
   a stress buffer layer disposed on the first surface of said die, said stress buffer layer being arranged so that said light sensing region is exposed to a light source located outside of said optical leadless leadframe package;
   a first encapsulant formed on said die and leadless leadframe, said first encapsulant comprising an opaque material and being arranged so that said light sensing region is exposed to said light source; and
   a second encapsulant formed directly atop and contacting said light sensing region, and also adjacent to said first encapsulant, said second encapsulant comprising a transparent or translucent material and adapted to transmit light therethrough from said light source to said light sensing region.

2. The optical leadless leadframe package of claim 1, wherein said die further includes one or more light sensitive areas that are shielded from said light source.

3. The optical leadless leadframe package of claim 2, wherein said one or more light sensitive areas are shielded from said light source by said first encapsulant.

4. The optical leadless leadframe package of claim 2, wherein said one or more light sensitive areas are shielded from said light source by said stress buffer layer.

5. The optical leadless leadframe package of claim 1, wherein said stress buffer layer forms a dam surrounding said light sensing region.

6. The optical leadless leadframe package of claim 5, wherein said die further includes one or more light sensitive areas that are shielded from said light source, and wherein said dam covers neither of said light sensing region nor said one or more light sensitive areas.

7. The optical leadless leadframe package of claim 1, wherein said first encapsulant includes one or more laser markings on an outer surface thereof.

* * * * *